United States Patent [19]
Pawlowski

[11] Patent Number: 5,848,431
[45] Date of Patent: *Dec. 8, 1998

[54] SYNCHRONOUS SRAMS HAVING MULTIPLE CHIP SELECT INPUTS AND A STANDBY CHIP ENABLE INPUT

[75] Inventor: J. Thomas Pawlowski, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

The term of this patent shall not extend beyond the expiration date of Pat. No. 5,787,489.

[21] Appl. No.: 391,725

[22] Filed: Feb. 21, 1995

[51] Int. Cl.$^6$ .................................................. G06F 12/00
[52] U.S. Cl. .............................. 711/5; 711/104; 711/169; 711/2; 365/230.03
[58] Field of Search ........................ 365/230.01, 230.03, 365/189.05, 233; 395/402, 405, 855, 881; 364/243, 254.4; 711/2, 5, 104, 169

[56] References Cited

U.S. PATENT DOCUMENTS

| | | | |
|---|---|---|---|
| 4,141,068 | 2/1979 | Mager et al. | 364/200 |
| 4,231,105 | 10/1980 | Schuller et al. | 364/900 |
| 4,912,630 | 3/1990 | Cochcroft, Jr. | 364/200 |
| 5,126,975 | 6/1992 | Handy et al. | 365/230.01 |
| 5,384,745 | 1/1995 | Konishi et al. | 365/230.03 |
| 5,490,116 | 2/1996 | Tobita et al. | 365/226 |
| 5,491,663 | 2/1996 | Teel | 365/189.05 |
| 5,550,783 | 8/1996 | Stephens, Jr. et al. | 365/233 |
| 5,602,798 | 2/1997 | Sato et al. | 365/233 |

OTHER PUBLICATIONS

Sony CXK77V3210Q Data Sheet. Rev. 14.0, Oct. 30, 1995.
Horton, Thomas. "Selecting the Right Cache Architecture for High Performance PCs." Sony Semiconductor Company of America. San Jose, CA., Apr. 1995.
IBM Press Release. "IBM Introduces Fast 1–Megabit SRAM Family.", Jun. 6, 1994.
IBM IBM043614PQKB Data Sheet, May 1994.
Izumikawa, Masanori et al. "A 400 MHz, 300 mW, 8kb, CMOS SRAM Macro with a Current Sensing Scheme." Custom Integrated Circuits Conference. IEEE, Feb. 1994.
Nakamura, Kazuyuki et al. "A 220 MHz Pipelined 16 Mb BiCMOS SRAM with PLL Proportional Self–Timing Generator." Solid–State Circuits, 1994 41st Conference, Jul. 1994.
Dickinson, Alex et al. "A Fast Pipelined CMOS SRAM." TENCON '92, IEEE Region 10 Conference, Nov. 11, 1992.
Gowni, Shiva P. et al. "A 9 ns, 32 k X 9, BiCMOS TTL Synchronous Cache RAM with Burst Mode Access." Proceedings of the IEEE 1992 Custom Integrated Circuits Conference, May 3, 1992.
Hitachi America, Ltd., Semiconductor & I.C. Division, "Hitachi's Synchronous Burst, Pipelined 1 Mbit (32 K x 32) SRAM Meets Industry Demand for Economical, Fast Cache Memory Devices for Pentium PCs", Mar. 13, 1995.
Millman, Jacob, "Microelectronics: Digital and Analog Circuits and Systems", McGraw–Hill, Inc., pp. 290–291, 1979.
Sloan, M. E., "Computer Hardware and Organization: An Introduction", Science Research Associates, Inc., p. 343, 1983.
Handy, Jim, "The Cache Memory Book", Academic Press, pp. 122, 201–205, 1993.
Hennessy et al., "Computer Organization and Design: The Hardware/Software Interface", Morgan Kaufmann Publishers, Inc. p. B–30, 1994.

*Primary Examiner*—Eddie P. Chan
*Assistant Examiner*—Kevin Verbrugge
*Attorney, Agent, or Firm*—Wells, St. John, Roberts Gregory & Matkin, P.S.

[57] ABSTRACT

A synchronous SRAM module comprises first and second SRAM chips. Each SRAM chip has three chip enable inputs. A module enable and memory selection circuit is coupled to the two SRAM chips to perform the dual tasks of (1) selectively enabling or disabling both SRAM chips and (2) choosing either the first or second SRAM chips for access. The SRAM module can also be placed in a pipelining mode where external signals from a microprocessor are ignored to facilitate internal operation, such as burst reads. A synchronous burst SRAM device employed in the SRAM module is also described.

21 Claims, 2 Drawing Sheets

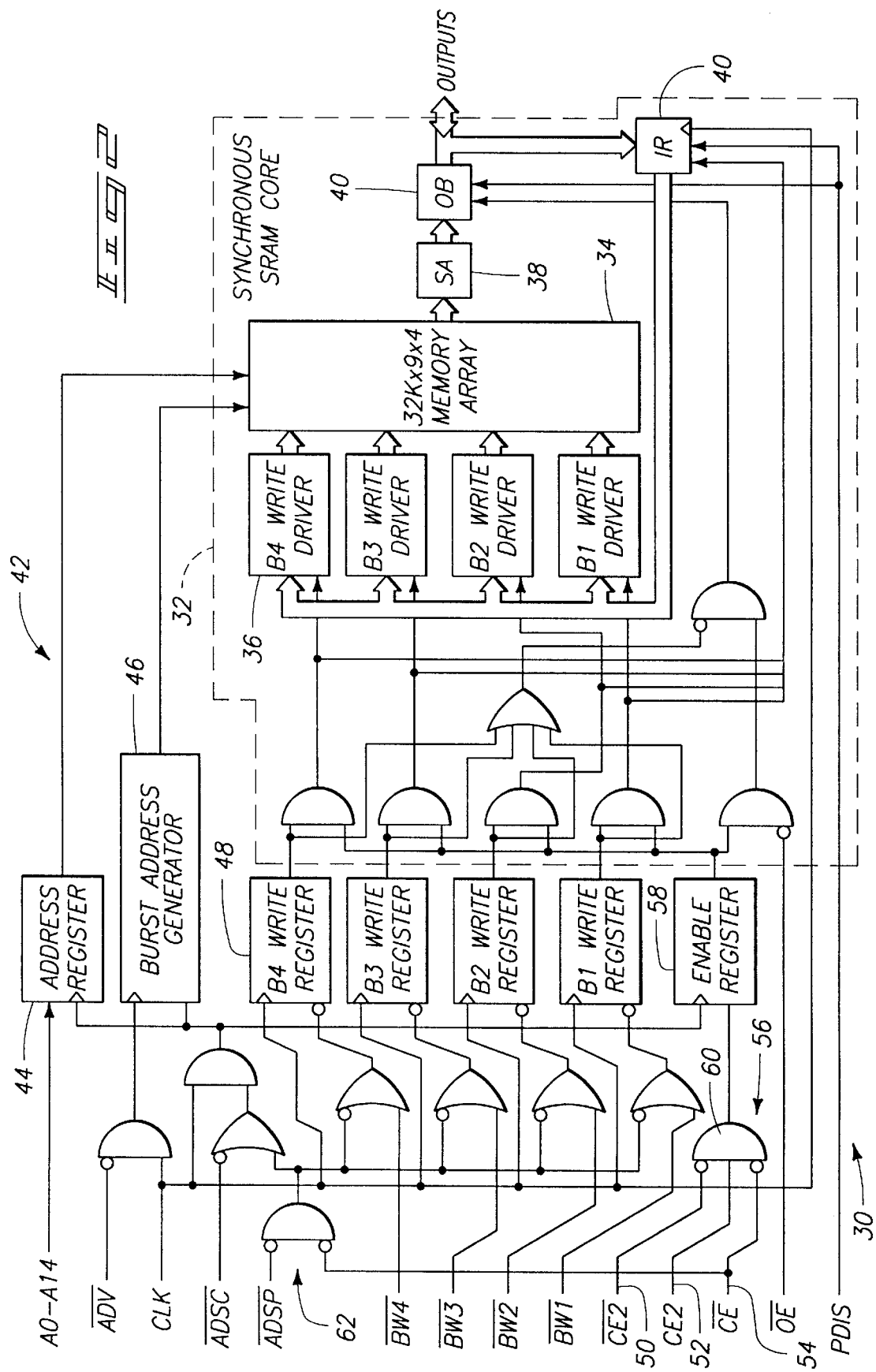

SYNCHRONOUS SRAMS HAVING MULTIPLE CHIP SELECT INPUTS AND A STANDBY CHIP ENABLE INPUT

TECHNICAL FIELD

This invention relates to synchronous SRAMs (Static Random Access Memories).

BACKGROUND OF THE INVENTION

Synchronous SRAMs are a type of SRAM that is registered and accessed in accordance with externally generated clock signals. The clock signal provides for synchronous operation of the SRAM.

In memory design evolution, memory devices commonly increase in size by a factor of four from one generation to the next. For example, the next generation memory device after a 256K bit memory device is a 1M bit device. Following the 1M device is the 4M device, and so on. This fourfold generational jump in memory size leaves a significant gap in memory depth between generation sizes. For example, suppose that a 32K×36 memory device and a 128K×36 memory device are available, but a designer wants to implement an intermediate memory size, such as a 64K×36 memory device. The ability to achieve intermediate memory sizes is desirable because it affords system design flexibility without the drawback of over or under utilizing memory capacity.

One common technique for achieving memory depth expansion is by stacking two or more memory devices together and adding external logic to control them. This is not a favorable alternative, however, because it complicates system level design. It is more desirable to provide the intermediate memory device size without introducing external logic.

To avoid the use of external logic, another prior art approach employs two separate SRAM devices, where each device is equipped with an active low and an active high chip select. The two chip selects are internally logically combined so that one signal is used to selectively access one of the two synchronous SRAMs. One of the drawbacks in this design, however, is that there is no ability to operably disable both devices simultaneously or operate the devices in a pipelining mode (discussed below).

One specific type of synchronous SRAMs is a synchronous burst SRAM which is designed in systems to achieve higher SRAM performance. Synchronous burst SRAMs have an internal counter which facilitates internal addressing of typically two to four addresses for each externally generated address that is loaded into the memory device. The internal "burst" addresses can be generated more rapidly in comparison to externally generating the same addresses and then loading them into the memory device using conventional techniques. Accordingly, the burst SRAMs operate faster and achieve higher performance.

It is desirable and advantageous for synchronous burst SRAMs to facilitate a microprocessor-related function known as "address pipelining". In general, a microprocessor attached to the synchronous burst SRAM outputs an address and data strobe signal each time a new address is ready for input into the SRAM device. On occasions, it may be desirable to delay execution of that new address. For example, in a synchronous burst SRAM, it might be desirable to continue the burst addressing operation before accepting the next external address. Accordingly, the synchronous burst SRAMs must be capable of blocking or delaying operation on the new address (as indicated by the address and data strobe signal from the microprocessor) until the burst operation is completed.

It is also worth noting that achieving intermediate sizes in memories can be costly. The economies are best realized through the fourfold generational size increase. There is a continuing need to design intermediate memory sizes that are also inexpensive to manufacture.

The synchronous SRAM of this invention overcomes the above drawbacks by providing an intermediate memory depth without use of external logic. The novel synchronous SRAM also includes a pipelining mode and a power down mode without expensive components or circuitry.

BRIEF DESCRIPTION OF THE DRAWINGS

Preferred embodiments of the invention are described below with reference to the accompanying drawings, which are briefly described below.

FIG. 2 illustrates a detailed block diagram of a synchronous burst SRAM device according to this invention. The FIG. 2 SRAM device is also representative of an SRAM unit that can be used in the FIG. 1 SRAM module.

DETAILED DESCRIPTION OF THE PREFERRED EMBODIMENTS

Figure 1:
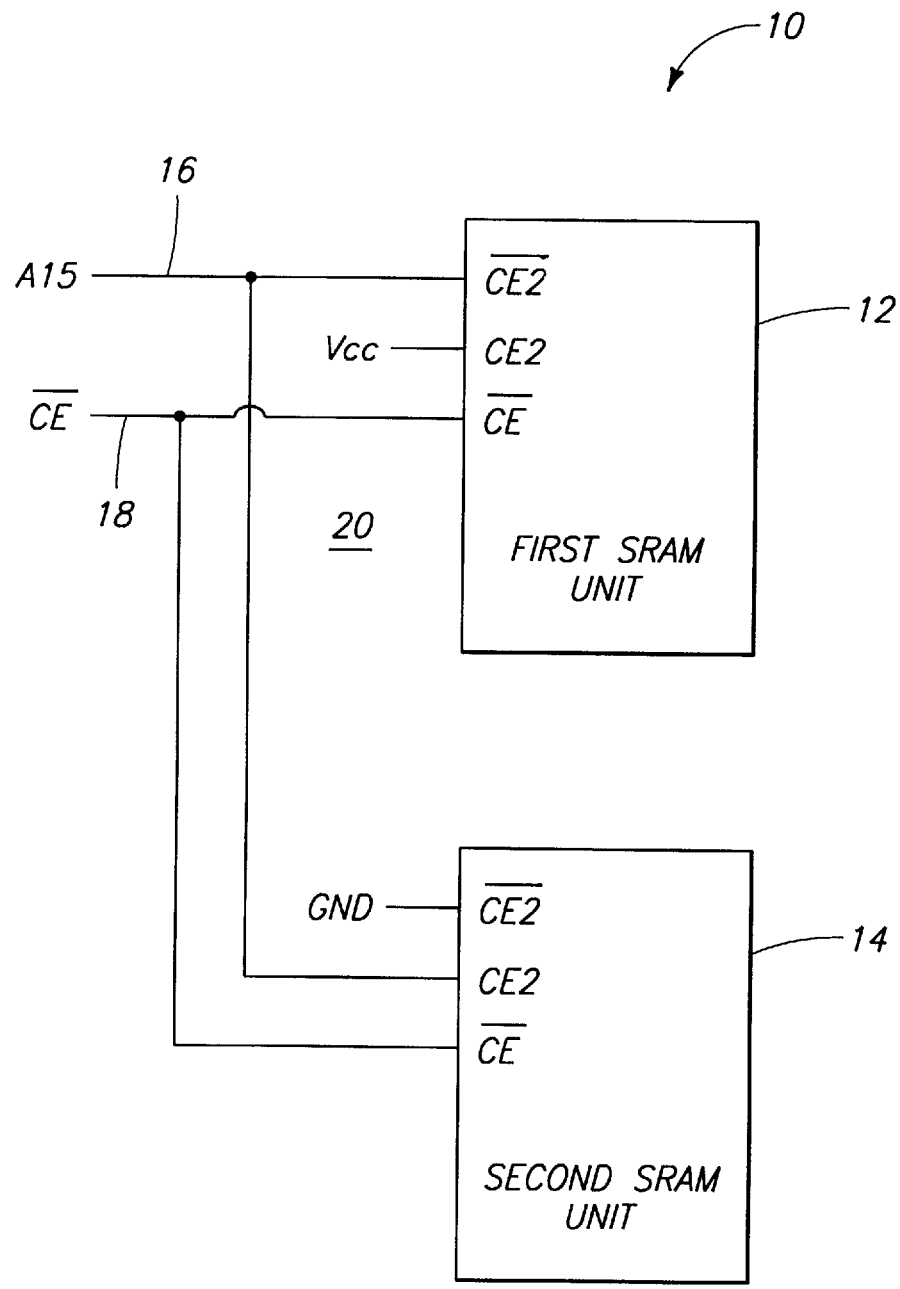
FIG. 1 illustrates a block diagram of a synchronous SRAM module constructed according to this invention. In the illustrated preferred construction, the synchronous SRAM module comprises two stacked SRAM units.

This disclosure of the invention is submitted in furtherance of the constitutional purposes of the U.S. Patent Laws "to promote the progress of science and useful arts" (Article 1, Section 8).

According to one aspect of this invention, a synchronous SRAM module comprises:

a first SRAM unit having a memory array and control circuitry for accessing the memory array, the first SRAM unit having first, and second, and third inputs;

a second SRAM unit having a memory array and control circuitry for accessing the memory array, the second SRAM unit having first, second, and third inputs;

a module enable and memory selection circuit operably coupled to selectively enable or disable both SRAM units and to choose one of the first and second SRAM units for access, the memory module enable and memory selection circuit generating a module enable signal and a memory select signal;

the memory select signal being coupled to at least one of the first and second inputs of the first and second SRAM units for selecting the first SRAM unit when the memory select signal is at one asserted logic level and for selecting the second SRAM unit when the memory select signal is at another asserted logic level; and the module enable signal being coupled to the third chip enable inputs of the first and second SRAM units for enabling operation of both SRAM units when the module enable signal is at one asserted logic level and for disabling operation of both SRAM units when the module enable signal is at another asserted logic level.

FIG. 1 illustrates a synchronous SRAM module 10 designed to provide an intermediate-sized memory device. SRAM module 10 includes a first SRAM unit 12 of a common memory size and a second SRAM unit 14 of a common memory size which are stacked together to effectively double the memory capacity. For example, first SRAM unit 12 and second SRAM unit 14 might both be 32K×36 synchronous SRAMs. When coupled together according to this invention, the first and second SRAM units form a 64K×36 synchronous SRAM module.

Both the first and second SRAM units comprise a memory array and control circuitry for accessing the memory array. One preferred embodiment of an SRAM unit is a synchronous burst SRAM device described below in more detail with reference to FIG. 2.

Each of the SRAM units 12 and 14 are equipped with three inputs. The three inputs are advantageous over prior art designs in that they serve the dual tasks of permitting selection of either the first SRAM unit 12 or the second SRAM unit 14, while also providing a means for powering down or disabling both SRAM units simultaneously.

More particularly, both SRAM units 12 and 14 have a first input $\overline{CE2}$, a second input CE2, and a third input $\overline{CE}$. The first input $\overline{CE2}$ of first SRAM unit 12 and the second input CE2 of second SRAM unit 14 are tied together to receive a memory select enable signal over conductor 16. The second input of first SRAM unit 12 is coupled to power $V_{CC}$ and the first input of second SRAM unit 14 is coupled to ground GND.

The first and second inputs respectively define chip select inputs, and the third input defines a chip enable input. According to this circuit construction, the memory select signal applied over conductor 16 operably chooses between the first SRAM unit 12 and the second SRAM unit 14 according to the asserted logic level of the signal. When the memory select enable signal is at one asserted logic level, such as asserted LOW, first SRAM unit 12 is chosen. Conversely, second SRAM unit 14 is selected when the memory select enable signal is at another asserted logic level, such as asserted HIGH. In the preferred embodiment, the memory select enable signal is a bit in an address used to access the memory array in the first or second SRAM units. As illustrated in FIG. 1, the most significant bit (MSB) A15 is used as the memory select signal to operably choose between the first SRAM unit 12 and the second SRAM unit 14.

A module enable signal $\overline{CE}$ is coupled via conductor 18 to the third input $\overline{CE}$ of the first and second SRAM units 12 and 14. The module enable signal enables operation of both SRAM units when the signal is at one asserted logic level, such as asserted LOW, and disables operation of both SRAM units when the module enable signal is at another asserted logic level, such as asserted HIGH. Memory module 10 of this invention is therefore advantageous over prior art designs in that it permits the entire module (comprising multiple SRAM units) to be completely powered down.

The illustrated coupling arrangement for stacking first and second SRAM units 12 and 14 is one preferred construction of a module enable and memory selection circuit 20 which in part controls operation of the synchronous SRAM module 10. It should be noted that other coupling arrangements defining circuit 20 can be used. For example, conductor 16 can be coupled to the second input CE2 of first SRAM unit 12 and to first input $\overline{CE2}$ of second SRAM unit 14. In this alternative construction, the first input $\overline{CE2}$ of first SRAM unit 12 would be connected to ground and the second input CE2 of second SRAM unit 14 would be connected to power.

FIG. 2 shows a preferred construction of a synchronous burst SRAM device 30 which can be incorporated as one of the SRAM units 12 and 14 in SRAM module 10. Synchronous burst SRAM device 30 includes an SRAM core 32 of conventional construction. Synchronous SRAM core 32 includes a memory array 34, one or more write drivers 36 for temporarily holding data for input into the memory array 34, sense amplifiers 38, and I/O buffers 40 (such as input registers IR and output buffers OB and optionally output registers) to facilitate transfer of data to and from the memory array.

Address control circuitry 42 is coupled to SRAM core 32 for accessing a selected location in the memory array within the SRAM core. Preferably, address control circuitry 42 comprises an address register 44 for receiving externally generated addresses A0–A14 and a burst address generator 46 coupled to the address register 44. The burst address generator 46 rapidly generates additional internal addresses using at least one, and preferably two or more, address bits stored in the address register. In this construction, burst address generator 46 comprises a two bit binary counter which employs the two least significant bits (LSB) A0 and A1 to generate additional addresses internally at a much higher rate as compared to external generation of the same addresses.

Synchronous burst SRAM device 30 has multiple one-bit write registers 48 which activate corresponding write drivers 36 to input data into the memory array during a write operation. When write registers 48 hold one binary bit, such as a "1", write drivers 36 are enabled to transfer data to memory array 34; whereas, when write registers 48 hold the other binary bit, such as a "0", the write drivers are not enabled indicating that a read operation is being performed. The write registers 48 are controlled by respective bit write signals $\overline{BW1}$, $\overline{BW2}$, $\overline{BW3}$, and $\overline{BW4}$ and a clock input signal CLK. The operation of write registers 48 is also partially controlled by the logical combination of the module enable signal $\overline{CE}$ and an external address signal $\overline{ADSP}$. In this embodiment, the external address signal is in the form of an address and data strobe from the microprocessor $\overline{ADSP}$ which indicates that an external address is ready to be loaded into address register 44.

The remaining inputs to the SRAM device 30 include: an address advance signal input $\overline{ADV}$ which is used to increment the binary counter in the burst address generator 46; an input to receive the address and strobe signal from the controller $\overline{ADSC}$; the three inputs $\overline{CE2}$, CE2, and $\overline{CE}$; an output enable input $\overline{OE}$ input; and optionally a parity disable PDIS input.

The three inputs are the same as those described above with reference to FIG. 1. For purposes of continuing discussion, assume that synchronous burst SRAM device 30 is used as the first SRAM unit 12 in the SRAM module 10 of FIG. 1. As shown in FIG. 1, the first input $\overline{CE2}$ (referenced by numeral 50) is coupled to receive the MSB A15, the second input CE2 (referenced by numeral 52) is tied to power $V_{CC}$, and the third input $\overline{CE}$ (referenced by numeral 54) is connected to receive the module enable signal.

Synchronous burst SRAM device 30 also includes chip enable and select logic 56 coupled to the three inputs 50, 52, and 54. The chip enable and select logic 56 performs the dual functions of (1) selectively enabling or disabling the synchronous burst SRAM device, and (2) selectively permitting access to the SRAM core 32 when the SRAM device is enabled. These functions are achieved based upon a boolean function of the signals at the three inputs. The chip enable and select logic 56 generates an SRAM core enable signal for enabling SRAM core 32 as a result of the boolean function provided by logic 56. A one-bit enable register 58 is coupled between the chip enable and select logic 56 and the SRAM core 32 for temporarily storing the SRAM core enable signal. In this manner, the SRAM core is merely responsive to a single enable signal held in register 58, although this single core enable signal is generated according to a relationship among the three signals to the entire SRAM device.

In the preferred form, chip enable and select logic 56 comprises a AND gate 60 having three inputs coupled to the three inputs 50, 52, 54 and an output coupled to enable register 58. The boolean function for combining the three signals $\overline{CE}, \overline{CE2}, CE2$ is defined as:

$$\overline{CE} \text{ AND } \overline{CE2} \text{ AND } CE2.$$

SRAM device 30 also includes address pipelining logic 62 which is coupled to at least one of the three inputs, and more specifically, to the third input 54. Pipelining logic 62 is provided to block the external address signal $\overline{ADSP}$ from notifying the chip that an external address is waiting to be loaded into the address register. This signal blocking function permits the synchronous burst SRAM device to operate in a pipelining mode. An example operation in the pipelining mode is to allow the burst address generator 46 to generate multiple additional addresses without interference from an external address as indicated by the external address signal $\overline{ADSP}$.

The pipelining logic 62 comprises a NOR gate having one input tied to the microprocessor produced address and data strobe $\overline{ADSP}$ and one input coupled to the module enable signal at the third input 54. In this manner, when the module enable signal at input 54 is at a selected asserted logic level, such as asserted HIGH, pipelining logic 62 blocks the external address signal $\overline{ADSP}$ from affecting operation of the SRAM device to thereby permit pipelining operation.

Chip enable and select logic 56, enable register 58, and pipelining logic 62 thereby provide device control circuitry for performing three desired functions: (1) selectively enabling or disabling the SRAM device, (2) selectively permitting access to the SRAM core when the SRAM device is enabled, and (3) selectively permitting pipelining operation of the SRAM device. The circuitry arrangement of this invention achieves these desired features without introducing additional external logic or circuitry. Additionally, this invention accomplishes these desired results through the use of inexpensive logic design comprised of a few logical gates and registers.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A synchronous SRAM module comprising:

a first SRAM unit having a memory array and control circuitry for accessing the memory array, the first SRAM unit having first, second, and third inputs, the control circuitry including an address register for receiving addresses for the memory array and a burst address generator coupled to the address register for rapidly generating additional addresses using at least one address bit stored in the address register;

a second SRAM unit having a second memory array and control circuitry for accessing the memory array, the second SRAM unit having first, second, and third inputs, the control circuitry of the second SRAM unit including a second address register for receiving addresses for the second memory array and a burst address generator coupled to the second address register for rapidly generating additional addresses using at least one address bit stored in the second address register;

a module enable and memory selection circuit operably coupled to selectively enable or disable both SRAM units by selectively powering up both SRAM units or powering down both SRAM units, and to choose one of the first and second SRAM units for access, the memory module enable and memory selection circuit generating a module enable signal and a memory select signal;

the memory select signal being coupled to at least one of the first and second inputs of the first and second SRAM units for selecting the first SRAM unit when the memory select signal is at one asserted logic level and for selecting the second SRAM unit when the memory select signal is at another asserted logic level; and the module enable signal being coupled to the third inputs of the first and second SRAM units for powering up both SRAM units when the module enable signal is at one asserted logic level and for powering down both SRAM units when the module enable signal is at another asserted logic level.

2. A synchronous SRAM module according to claim 1 wherein:

the memory select signal is coupled to the first input of the first SRAM unit and to the second input of the second SRAM unit;

the second input of the first SRAM unit is coupled to power; and the first input of the second SRAM unit is coupled to ground.

3. A synchronous SRAM module according to claim 1 wherein the memory select signal is a bit in an address used to access the memory array of one of the first and second SRAM units.

4. A synchronous SRAM device comprising:

an SRAM core having a memory array, write drivers, sense amplifiers, and I/O buffers;

address control circuitry for accessing a selected location of the memory array within the SRAM core;

three inputs for receiving respective signals; and a device control circuit coupled to the SRAM core and the three inputs, the device control circuit performing the dual tasks of (1) selectively powering up or powering down the synchronous SRAM device and (2) selectively permitting access to the SRAM core when enabled in accordance with a boolean function of the signals at the three inputs.

5. A synchronous SRAM device according to claim 4 wherein the device control circuit comprises:

chip enable and select logic coupled to the three inputs to process the signals according to the boolean function and output an SRAM core enable signal; and an enable register for temporarily storing the SRAM core enable signal.

6. A synchronous SRAM device according to claim 5 wherein the chip enable and select logic comprises an AND gate receiving the three inputs and an output coupled to the enable register.

7. A synchronous SRAM device according to claim 4 wherein the signals comprise $\overline{CE}$, $\overline{CE2}$, and CE2, and the boolean function is defined as:

$$\overline{CE} \text{ AND } \overline{CE2} \text{ AND } CE2.$$

8. A synchronous SRAM device according to claim 4 wherein the address control circuitry includes:
an address register for receiving addresses for the memory array in the SRAM core; and
a burst address generator coupled to the address register for rapidly generating additional addresses using at least one address bit stored in the address register.

9. A synchronous SRAM device according to claim 4 further comprising:
an input for receiving an external address signal indicating that an external address is waiting at the address control circuit;
the device control circuit includes pipelining logic coupled to one of the three inputs to block the external address signal when the signal at the one input is at a selected asserted logic level to thereby permit pipelining operation of the SRAM device.

10. A synchronous SRAM module comprising:
(a) a first SRAM unit comprising:
  (1) an SRAM core having a memory array, write drivers, sense amplifiers, and I/O buffers;
  (2) address control circuitry for accessing a selected location of the memory array within the SRAM core;
  (3) first, second, and third inputs for receiving at least a module enable signal and a memory select signal;
  (4) a device control circuit coupled to the SRAM core and the chip inputs, the device control circuit performing the dual functions of (1) selectively powering up the first SRAM unit and (2) selectively permitting access to the SRAM core when the first SRAM unit is enabled in accordance with the module enable signal and the memory select signal;
(b) a second SRAM unit comprising:
  (1) an SRAM core having a memory array, write drivers, sense amplifiers, and I/O buffers;
  (2) address control circuitry for accessing a selected location of the memory array within the SRAM core;
  (3) first, second, and third inputs for receiving at least the module enable signal and a memory select signal;
  (4) a device control circuit coupled to the SRAM core and the inputs, the device control circuit performing the dual functions of (1) selectively powering up the second SRAM unit and (2) selectively permitting access to the SRAM core when the second SRAM unit is enabled in accordance with the module enable signal and the memory select signal;
the memory select signal selecting the first SRAM unit when the memory select signal is at one asserted logic level and selecting the second SRAM unit when the memory select signal is at another asserted logic level; and
the module enable signal enabling operation of both SRAM units when the module enable signal is at one asserted logic level and disabling operation of both SRAM units when the module enable signal is at another asserted logic level.

11. A synchronous SRAM module according to claim 10 wherein:
the memory select signal is coupled to the first input of the first SRAM unit and to the second input of the second SRAM unit;
power is coupled to the second input of the first SRAM unit;
ground is coupled to the first input of the second SRAM unit; and
the module enable signal is coupled to the third inputs of the first and second SRAM units.

12. A synchronous SRAM module according to claim 10 wherein the memory select signal is a bit in an address that is input to address control circuitry for accessing the selected memory array location.

13. A synchronous SRAM module according to claim 10 wherein the device control circuits of the first and second SRAM units individually comprise:
chip enable and select logic coupled to the inputs to process the module enable signal and the memory select signal according to a boolean function and output an SRAM core enable signal; and
an enable register for temporarily storing the SRAM core enable signal.

14. A synchronous SRAM module according to claim 13 wherein the chip enable and select logic comprises an AND gate having three inputs coupled to the inputs and an output coupled to the enable register.

15. A synchronous SRAM module according to claim 10 wherein the address control circuitry of the first and second SRAM units individually include:
an address register for receiving addresses for the memory array in the SRAM core; and
a burst address generator coupled to the address register for rapidly generating additional addresses using at least one address bit stored in the address register.

16. A synchronous SRAM module according to claim 10 wherein:
the first and second SRAM units include an input for receiving an external address signal indicating that an external address is waiting at the address control circuit; and
the device control circuits of the first and second SRAM units include pipelining logic coupled to one of the inputs to block the external address signal when the module enable signal received at the one input is at a selected asserted logic level to permit pipelining operation of the SRAM module.

17. A synchronous burst SRAM device comprising:
an SRAM core having a memory array, write drivers, sense amplifiers, and I/O buffers;
an address register for receiving addresses for the memory array in the SRAM core;
a burst address generator coupled to the address register for rapidly generating additional addresses using at least one address bit stored in the address register;
an input for receiving an external address signal indicating that an external address is ready to be loaded into the address register;
three inputs for receiving chip enable signals;
chip enable and select logic coupled to the three inputs to perform the dual tasks of (1) selectively powering the synchronous burst SRAM device and (2) selectively permitting access to the SRAM core when the SRAM device is enabled in accordance with a boolean function of the chip enable signals at the three inputs, the chip enable and select logic outputting an SRAM core enable signal resulting from the boolean function of the chip enable signals;
an enable register coupled between the chip enable and select logic and the SRAM core for temporarily storing the SRAM core enable signal; and pipelining logic coupled to at least one of the three inputs to block the external address signal when one chip enable signal received at the one input is at a selected asserted logic level to thereby permit pipelining operation of the synchronous burst SRAM device.

18. A synchronous SRAM device according to claim 17 wherein the chip enable and select logic comprises an AND gate having three inputs coupled to the three inputs and an output coupled to the enable register.

19. A synchronous SRAM device according to claim 17 wherein the chip enable signals comprise $\overline{CE}$, $\overline{CE2}$, and CE2, and the boolean function is defined as:

$$\overline{CE} \text{ AND } \overline{CE2} \text{ AND } CE2.$$

20. A synchronous SRAM device comprising:
an SRAM core having a memory array, write drivers, sense amplifiers, and I/O buffers;
address control circuitry for accessing a selected location of the memory array within the SRAM core, the address control circuitry including an address register for receiving addresses for the memory array in the SRAM core, and a burst address generator coupled to the address register for rapidly generating additional addresses using at least one address bit stored in the address register;
three inputs for receiving chip enable signals;
an input for receiving an external address signal indicating that an external address is waiting at the address control circuit; and
a device control circuit coupled to the SRAM core and the three inputs, the device control circuit performing the dual tasks of (1) selectively powering the synchronous SRAM device and (2) selectively permitting access to the SRAM core when enabled in accordance with a boolean function of the chip enable signals at the three inputs, the device control circuit including an enable register for temporarily storing the SRAM core enable signal, and chip enable and select logic coupled to the three [chip enable] inputs to process the chip enable signals according to the boolean function and to output an SRAM core enable signal, the chip enable and select logic including an AND gate having three inputs coupled to the three inputs and an output coupled to the enable register, the device control circuit including pipelining logic coupled to one of the three inputs to block the external address signal when the chip enable signal at the one input is at a selected asserted logic level to provide pipelining operation of the SRAM device.

21. A synchronous SRAM module comprising:
a first SRAM unit comprising:
an SRAM core having a memory array, write drivers, sense amplifiers, and I/O buffers;
address control circuitry for accessing a selected location of the memory array within the SRAM core, the address control circuitry including an address register for receiving addresses for the memory array in the SRAM core, and a burst address generator coupled to the address register to rapidly generate additional addresses;
first, second, and third inputs for receiving at least a module enable signal and a memory select signal;
a device control circuit coupled to the SRAM core and the inputs, the device control circuit performing the dual functions of selectively powering the first SRAM unit and selectively permitting access to the SRAM core when the first SRAM unit is enabled in accordance with the module enable signal and the memory select signal, the device control circuit including chip enable and select logic coupled to the first, second, and third inputs to process the module enable signal and the memory select signal according to a boolean function and output an SRAM core enable signal, and the device control circuit including an enable register for temporarily storing the SRAM core enable signal;
a second SRAM unit identical to the first SRAM unit and comprising:
an SRAM core having a memory array, write drivers, sense amplifiers, and I/O buffers;
address control circuitry for accessing a selected location of the memory array within the SRAM core, the address control circuitry of the second SRAM unit including an address register for receiving addresses for the memory array in the SRAM core, and a burst address generator coupled to the address register of the second SRAM unit to rapidly generate additional addresses;
first, second, and third inputs for receiving at least the module enable signal and a memory select signal;
a device control circuit coupled to the SRAM core and the inputs, the device control circuit of the second SRAM unit performing the dual functions of selectively powering the second SRAM unit and selectively permitting access to the core of the second SRAM unit when the second SRAM unit is enabled in accordance with the module enable signal and the memory select signal, the device control circuit of the second SRAM unit including chip enable and select logic coupled to the first, second, and third inputs of the second SRAM unit to process the module enable signal and the memory select signal according to a boolean function and output an SRAM core enable signal, and the device control circuit of the second SRAM unit including an enable register for temporarily storing the SRAM core enable signal produced by the device control circuit of the second SRAM unit;
the memory select signal selecting the first SRAM unit when the memory select signal is at one asserted logic level and selecting the second SRAM unit when the memory select signal is at another asserted logic level, the memory select signal being coupled to the first input of the first SRAM unit and to the second input of the second SRAM unit, the second input of the first SRAM unit being coupled to power and the first input of the second SRAM unit being coupled to ground, the memory select enable signal being a bit in an address that is input to the address control circuitry for accessing the selected memory array location of the selected SRAM unit; and
the module enable signal enabling operation of both SRAM units when the module enable signal is at one asserted logic level and disabling operation of both SRAM units when the module enable signal is at another asserted logic level, the module enable signal being coupled to the third inputs of the first and second SRAM units.

* * * * *

UNITED STATES PATENT AND TRADEMARK OFFICE
CERTIFICATE OF CORRECTION

PATENT NO.    : 5,848,431
DATED         : December 8, 1998
INVENTOR(S)   : J. Thomas Pawlowski It is certified that errors appear in the above-identified patent and that said Letters Patent is hereby corrected as shown below:

Column 3, line 20, delete "enable".

Column 9, line 42, delete "[chip enable]".

Signed and Sealed this

Eighteenth Day of May, 1999

Attest:

Q. TODD DICKINSON

Attesting Officer     Acting Commissioner of Patents and Trademarks